United States Patent
Ha et al.

[11] Patent Number: 6,134,457
[45] Date of Patent: Oct. 17, 2000

[54] DEVICE AND METHOD FOR MONITORING A BATTERY IN A MOBILE COMMUNICATION TERMINAL

[75] Inventors: Sang-Wook Ha; Joung-Kyou Park, both of Suwon, Rep. of Korea

[73] Assignee: Samsung Electronics Co., Ltd., Rep. of Korea

[21] Appl. No.: 09/116,728

[22] Filed: Jul. 16, 1998

[30] Foreign Application Priority Data

Jul. 16, 1997 [KR] Rep. of Korea ....................... 97-33173

[51] Int. Cl.7 ...................................................... H04M 1/73
[52] U.S. Cl. ........................... 455/572; 455/573; 324/429
[58] Field of Search .................................. 320/162, 132; 324/426, 429; 455/425, 572, 573, 38.3

[56] References Cited

U.S. PATENT DOCUMENTS

| | | | |
|---|---|---|---|
| 3,909,708 | 9/1975 | Champlin | 324/431 |
| 5,140,269 | 8/1992 | Champlin | 324/433 |
| 5,700,089 | 12/1997 | McKinnon | 374/142 |
| 5,748,675 | 5/1998 | Hormel et al. | 375/257 |
| 5,831,435 | 11/1998 | Troy | 324/426 |
| 5,973,499 | 10/1999 | Schulmann | 324/503 |
| 6,009,319 | 12/1999 | Khullar et al. | 455/343 |

*Primary Examiner*—Edward F. Urban
*Assistant Examiner*—Isaak R. Jama
*Attorney, Agent, or Firm*—Dilworth & Barrese

[57] ABSTRACT

A battery monitoring device for a mobile communication terminal having a display. A current sink consumes a traffic mode current in response to a control signal output from a microprocessor. An analog-to-digital converter converts a voltage signal output from the current sink to a digital signal. The microprocessor compares the output signal of the analog-to-digital converter with threshold values stored in an internal memory to determine the remaining capacity of the battery. The remaining capacity of the battery is then displayed on the display.

5 Claims, 3 Drawing Sheets

DEVICE AND METHOD FOR MONITORING A BATTERY IN A MOBILE COMMUNICATION TERMINAL

BACKGROUND OF THE INVENTION

1. Field of the Invention

The present invention relates to mobile communication terminals, and in particular, to a device and method for monitoring the remaining capacity of a battery within the mobile communication terminal.

2. Description of the Related Art

FIG. 1 shows a conventional battery monitoring device for a mobile communication terminal such as a cellular telephone. Referring to FIG. 1, an output voltage of a battery 50 is applied to an analog-to-digital converter (ADC) 20 via a multiplexer (Miux) 30. The ADC 20 converts the input voltage signal to a digital signal. A microprocessor 10 compares the digital signal output from the ADC 20 with a stored threshold value and displays a "LOW BATTERY" state on a display 60 if the digital signal has a level lower than the threshold value. In addition, a voltage characteristic of battery 50 depends on the ambient temperature. Thus, to accurately monitor the battery, the device includes a temperature sensor 40 for sensing temperature of the mobile communication terminal. Multiplexer 30 multiplexes the signals input from the temperature sensor 40 and the battery 50 in response to a control signal output from the microprocessor 10. The microprocessor 10 controls the overall operations of the mobile communication terminal according to the control program in a memory with the threshold value.

In general, the mobile communication terminal has a sleep mode, an idle mode, and a traffic mode, each mode having different current consumption. FIG. 2 shows the voltage characteristics of the battery 50 with respect to the lapse of time. In the drawing, reference numeral 1 denotes a curve illustrating the current consumption (or the discharge time) while in the traffic mode, reference numeral 2 a curve illustrating the current consumption while in the idle mode, and reference numeral 3 a curve illustrating the current consumption while in the sleep mode.

In view of the different current consumption characteristics based on operational modes, the battery 50 may be in a "LOW BATTERY" state during the traffic mode, even though it is not in the "LOW BATTERY" state during the idle mode or the sleep mode. Hence, the user of the mobile communication terminal can not predict the "LOW BATTERY" state well enough in advance, and as such, they may not have enough time to replace the battery with a new one or recharge the existing battery.

SUMMARY OF THE INVENTION

It is therefore an object of the present invention to provide a device and method for monitoring the remaining capacity of a battery for a traffic mode even in an idle mode and a sleep mode.

To achieve the above object, the present invention provides a device for monitoring a battery in a mobile communication terminal including a display. A current sink consumes a traffic mode current in response to a control signal output from a microprocessor. An analog-to-digital converter converts a voltage signal output from the current sink to a digital signal, and the microprocessor compares the output digital signal with the threshold values stored in an internal memory to determine the remaining capacity of the battery. The remaining capacity of the battery is displayed on the display.

Preferably, the threshold values comprise a first threshold value for a sleep mode, a second threshold value for an idle mode, and a third threshold value for a traffic mode.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Figure 1:
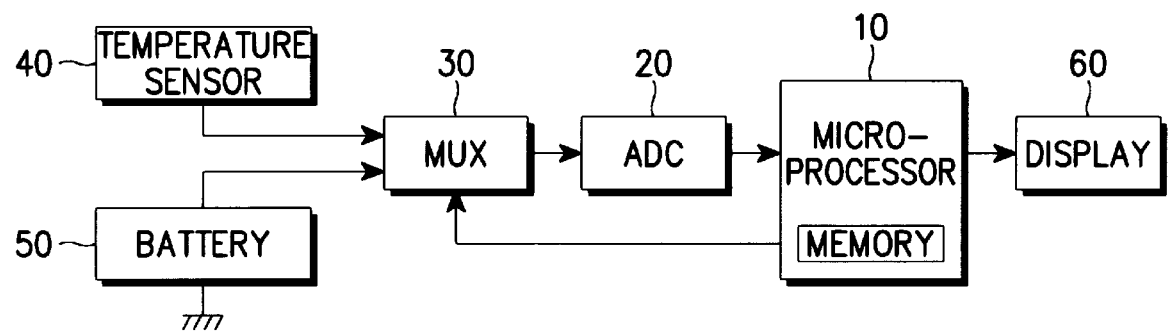
FIG. 1 is a block diagram of a conventional battery monitoring device for a mobile communication terminal.
Figure 2:
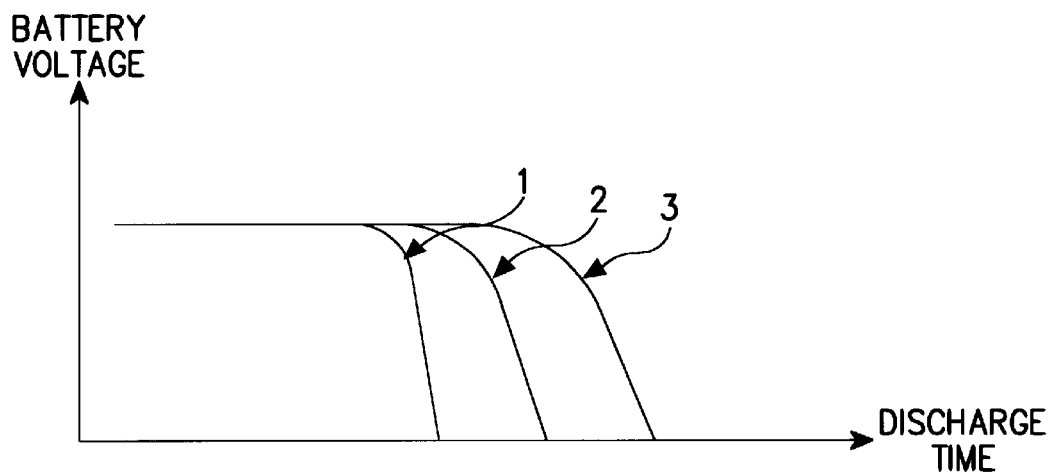
FIG. 2 is a diagram illustrating the voltage characteristics of battery 50 of FIG. 1 with respect to time.

An embodiment of the present invention will be described in detail hereinbelow with reference to the accompanying drawings in which the like reference numerals denote the like elements. In order to facilitate a comprehensive understanding, the present invention will be illustratively described with reference to a specific embodiment. In the following description, well-known functions or constructions which may obscure the present invention in unnecessary detail are not described in detail.

Figure 3:
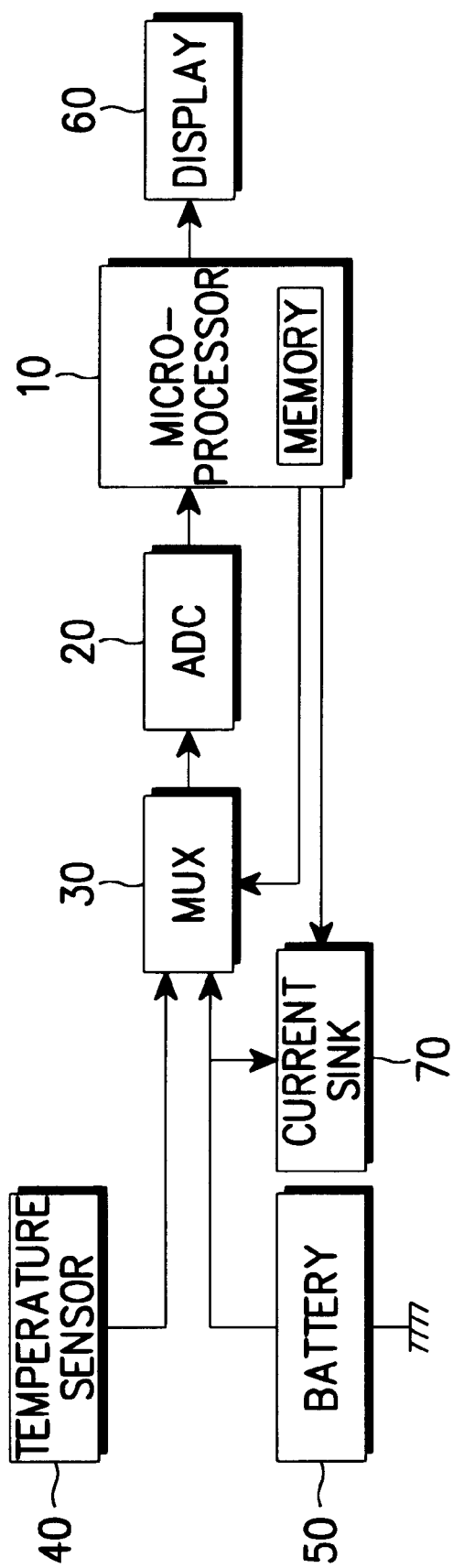
FIG. 3 is a block diagram of a battery monitoring device for a mobile communication terminal according to an embodiment of the present invention.

FIG. 3 shows a block diagram of a battery monitoring device for the mobile communication terminal according to an embodiment of the present invention. Microprocessor 10 controls the overall operations of the mobile communication terminal according to the control program. The threshold values stored in the memory include a first threshold value for the sleep mode, a second threshold value for the idle mode, and a third threshold value for the traffic mode. A current sink 70, under the control of the microprocessor 10, consumes a traffic mode current (which corresponds to the current during the traffic mode) at regular intervals. An ADC 20 converts a voltage signal output from the current sink 70, via MUX 30, to a digital signal. The microprocessor 10 compares the digital signal output from the ADC 20 with the threshold values. The multiplexer 30 multiplexes the input signals to the ADC 20 under the control of the microprocessor 10. A display 60, composed of an LCD (Liquid Crystal Display), displays the battery state according to a control signal output from the microprocessor 10. The temperature sensor 40 senses the temperature of the mobile communication terminal to take the temperature variation into account in monitoring the battery.

Figure 4:
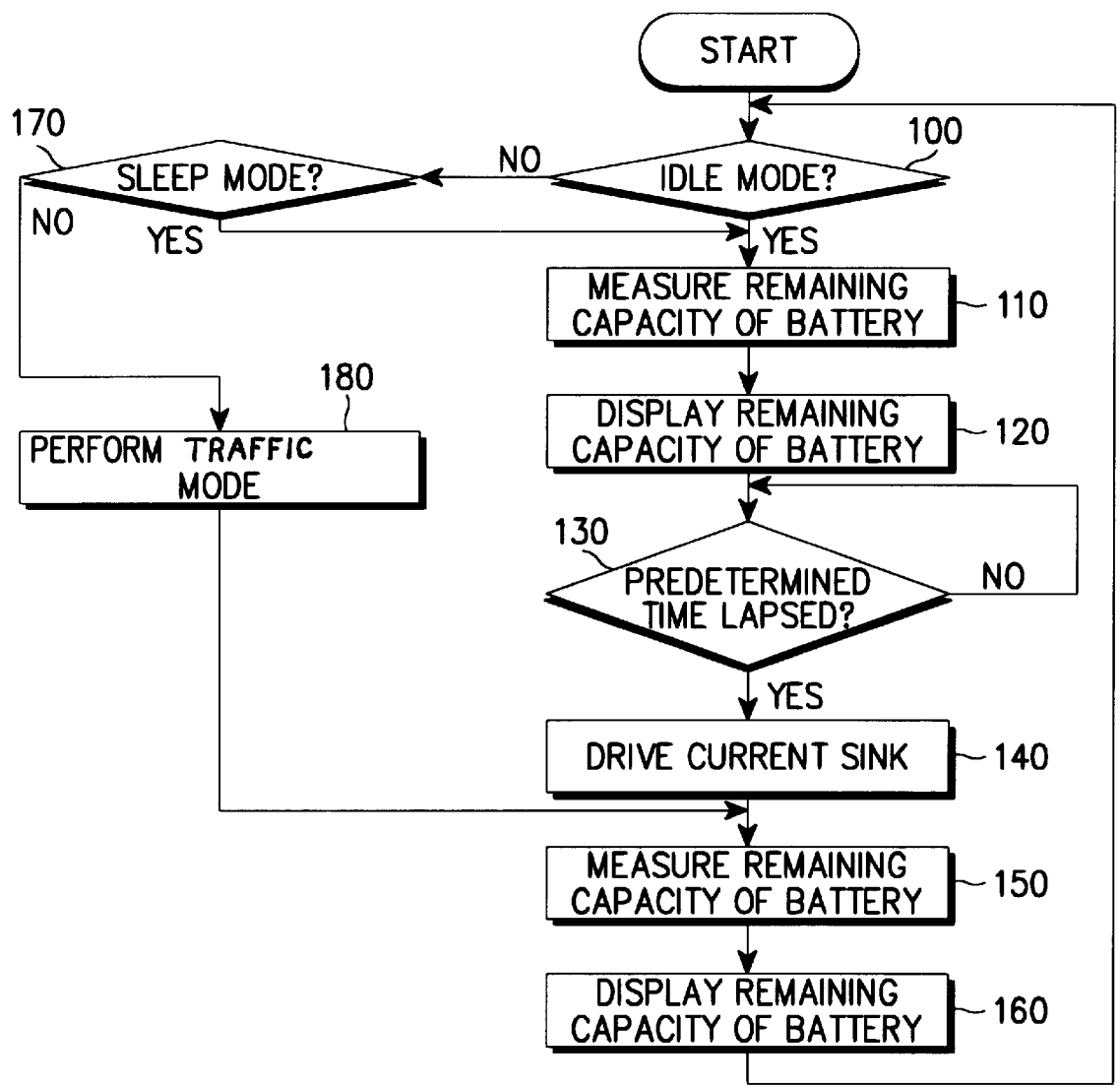
FIG. 4 is a flow chart illustrating the procedure for monitoring the battery in the mobile communication terminal according to an embodiment of the present invention.

FIG. 4 is a flow chart illustrating the procedure for monitoring the battery 50 according to an embodiment of the present invention. Referring to FIGS. 3 and 4, the microprocessor 10 determines whether the mobile communication terminal is in the idle mode (step 100). If it is in the idle mode, the microprocessor 10 measures the remaining capacity of the battery 50 (step 110). For measuring the remaining capacity of the battery 50, the ADC 20 receives the DC voltage output from the battery 50 via multiplexer 30 and converts it to the digital signal. Microprocessor 10 then compares the digital signal output from the ADC 20 with the second threshold value for the idle mode to determine the remaining capacity of the battery 50. As a result, if the digital signal is lower than the second threshold value, the microprocessor 10 displays the "LOW BATTERY" state on display 60 (step 120).

Thereafter, the microprocessor 10 allows a predetermined amount of time to pass (step 130) and then controls the current sink 70 to consume the traffic mode current (step 140). Then, microprocessor 10 measures the remaining capacity of the battery 50 by comparing the output voltage of the current sink 70 with the third threshold voltage for the traffic mode (step 150). Microprocessor 10 displays the measured remaining capacity of the battery 50 on the display 60 (step 160).

If the mobile communication terminal is not in the idle mode in step 100, microprocessor 10 determines whether the mobile communication terminal is in the sleep mode (step 170). When it is in the sleep mode, the microprocessor 10 measures the remaining capacity of the battery 50 by comparing the output voltage of the battery 50 with the first threshold value for the sleep mode (step 110).

If the mobile communication terminal is not in the sleep mode in step 170, the microprocessor 10 performs the traffic mode in step 180 and proceeds to step 150 to measure the remaining capacity of the battery 50 by comparing the output voltage of the battery 50 with the third threshold value.

As can be appreciated from the foregoing, the battery monitoring device of the invention can measure the current consumption for the traffic mode even when in the idle and sleep mode, thereby monitoring the remaining capacity of the battery for the traffic mode. Thus, enabling the user to have more time to deal with the low battery state (i.e., time to replace or recharge the battery).

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A device for monitoring a battery in a mobile communication terminal having a display, comprising:

a current sink that creates a traffic mode current in response to a first control signal when the mobile communication terminal is operating in a mode that consumes less current than the traffic mode current;

an analog-to-digital converter that converts a voltage signal output from the current sink into a digital signal;

a memory that stores at least one threshold value; and a controller that generates said first control signal, compares an output signal of the analog-to-digital converter with a threshold value for the traffic mode to determine a remaining capacity of the battery in the traffic mode, and displays the remaining capacity of the battery in the traffic mode on the display.

2. The device for monitoring a battery as claimed in claim 1, wherein the threshold values comprise a first threshold value for a sleep mode, a second threshold value for an idle mode, and a third threshold value for a traffic mode.

3. A method for monitoring a battery in a mobile communication terminal including a current sink for consuming a traffic mode current, an analog-to-digital converter for converting an output voltage of the current sink to a digital signal, a memory for storing threshold values, and a display, said method comprising the steps of:

determining whether the mobile communication terminal is in an idle mode;

measuring a remaining capacity of the battery mode when the mobile communication terminal is in the idle mode, and displaying the measured remaining capacity on the display;

determining whether the mobile communication terminal is in a sleep mode, when the mobile communication terminal is not in the idle mode;

measuring the remaining capacity of the battery when the mobile communication terminal is in the sleep mode, and displaying the measured remaining capacity on the display; and after the lapse of a predetermined time, measuring current consumption for the traffic mode by driving the current sink to determine the remaining capacity of the battery and displaying the measured remaining capacity on the display.

4. Method for monitoring a battery in a mobile communication terminal comprising the steps of:

determining whether the mobile communication terminal is in an idle mode or sleep mode;

measuring a remaining capacity of the battery when the mobile communication terminal is in the idle or sleep mode;

displaying the measured remaining capacity on a display;

creating a traffic mode current in response to a first control signal when the mobile communication terminal is in said idle or sleep mode;

in response to said creating step, determining the remaining capacity of the battery for said traffic mode; and displaying the measured remaining capacity on the display.

5. The method as claimed in claim 4, wherein said step of determining the remaining capacity for a traffic mode further comprises the steps of:

allowing a predetermined amount of time to lapse; and measuring current consumption for the traffic mode by driving a current sink.

* * * * *